(12) United States Patent
Matsumoto (10) Patent No.: US 10,663,815 B2
(45) Date of Patent: May 26, 2020

(54) INSPECTION METHOD AND INSPECTION SYSTEM FOR WIRING PATH OF SUBSTRATE

(71) Applicant: SAKAI DISPLAY PRODUCTS CORPORATION, Sakai-shi, Osaka (JP)

(72) Inventor: Naoki Matsumoto, Sakai (JP)

(73) Assignee: SAKAI DISPLAY PRODUCTS CORPORATION, Sakai-shi, Osaka (JP)

( * ) Notice: Subject to any disclaimer, the term of this patent is extended or adjusted under 35 U.S.C. 154(b) by 72 days.

(21) Appl. No.: 16/090,192

(22) PCT Filed: Mar. 28, 2016

(86) PCT No.: PCT/JP2016/059974
§ 371 (c)(1),
(2) Date: Sep. 28, 2018

(87) PCT Pub. No.: WO2017/168530
PCT Pub. Date: Oct. 5, 2017

(65) Prior Publication Data
US 2019/0113788 A1      Apr. 18, 2019

(51) Int. Cl.
*G02F 1/1345* (2006.01)
*G02F 1/1362* (2006.01)
(Continued)

(52) U.S. Cl.
CPC .......... *G02F 1/1345* (2013.01); *G01R 31/50* (2020.01); *G02F 1/13* (2013.01); *G02F 1/1362* (2013.01);
(Continued)

(58) Field of Classification Search
CPC ..... G02F 1/00; G02F 1/01; G02F 1/13; G02F 1/133; G02F 1/1333; G02F 1/1345;
(Continued)

(56) References Cited

U.S. PATENT DOCUMENTS 6,297,080 B1 * 10/2001 Lee ................. G02F 1/1368
438/151
7,123,044 B2 * 10/2006 Orii ................. G02F 1/136259
324/760.02
(Continued)

FOREIGN PATENT DOCUMENTS

CN         103858017 A    6/2014
JP         S63-111474 A   5/1988
(Continued)

*Primary Examiner* — Hoai-An D. Nguyen
(74) *Attorney, Agent, or Firm* — ScienBiziP, P.C.

(57) ABSTRACT

Provided is a substrate wiring path inspection system whereby, at the time of performing electrical inspection of a wiring path of a substrate having a surface on which a plurality of electrically independent wiring paths are formed, whether a probe is reliably electrically connected to the wiring path can be easily checked at a low equipment cost. The present invention is configured by being provided with: a probe set 2 to be in contact with end portions of a plurality of wiring paths 31-34 formed on a substrate 1; a flexible conductor 9 that short-circuits the wiring paths 31-34 at portions excluding the end portions; and an inspection device 4 which is provided with a determination section 8 that determines whether a resistance value between a pair of wiring lines is lower than a predetermined value, said pair of wiring lines having been selected from among the wiring lines 31-34 short-circuited by the flexible conductor 9.

9 Claims, 5 Drawing Sheets

(51) Int. Cl.
*G01R 31/02* (2006.01)
*G09G 3/00* (2006.01)
*H05K 3/00* (2006.01)
*G02F 1/13* (2006.01)
*G01R 31/50* (2020.01)
*G09G 3/36* (2006.01)
*G01R 27/02* (2006.01)

(52) U.S. Cl.
CPC ............... *G09G 3/006* (2013.01); *H05K 3/00* (2013.01); *G01R 27/02* (2013.01); *G02F 2001/136254* (2013.01); *G09G 3/36* (2013.01); *G09G 2300/0426* (2013.01)

(58) Field of Classification Search
CPC .. G02F 1/136; G02F 1/1362; G02F 1/136286; G02F 2001/136254; G01R 31/00; G01R 31/025; G01R 31/50; G01R 27/00; G01R 27/02; G09G 3/00; G09G 3/006; G09G 3/20; G09G 3/34; G09G 3/36; G09G 2300/0426; H05K 3/00

USPC .......... 324/500, 503, 512, 525, 537, 754.01, 324/754.03, 72.5, 76.11, 149, 600, 649, 324/691, 713, 715, 718; 702/1, 57, 64
See application file for complete search history.

(56) References Cited

U.S. PATENT DOCUMENTS 8,890,833 B2* 11/2014 You .................. G06F 3/045
  345/174
9,188,822 B2* 11/2015 Kim ................. G02F 1/1345
9,851,832 B2* 12/2017 Yang ................ G06F 3/044

FOREIGN PATENT DOCUMENTS

| JP | H06-095143 A | 4/1994 |
| JP | 2000-193705 A | 7/2000 |
| JP | 2004-132861 A | 4/2004 |

* cited by examiner

INSPECTION METHOD AND INSPECTION SYSTEM FOR WIRING PATH OF SUBSTRATE

TECHNICAL FIELD

The present invention relates to an inspection method and an inspection system for inspecting a plurality of wiring paths electrically independent of one another on a substrate for defects in a manner that contact probes are brought into contact with the wiring paths.

BACKGROUND ART

In defect inspection of a plurality of wirings formed on a substrate, contact probes are brought into contact with ends of wirings for example for inspection for short circuit or inspection of insulation resistance through the probes.

Patent Literature 1 discloses a wiring inspection apparatus for inspecting wirings on print wiring boards or substrates for various types of semiconductor packages for electrical defects. The apparatus includes a first inspection stage at which inspection for opening or short circuit is performed using a conductive rubber piece and a second inspection stage at which inspection is performed using a flying prober that needs no inspection jig.

Patent Literature 2 discloses a circuit board inspection apparatus including contact probes capable of being in contact with a plurality of conductive patterns formed on a circuit board and a short circuit board for electrically short-circuiting the conductive patterns on the substrate. The apparatus is configured to selectively use the contact probes and the short circuit board according to inspection items.

CITATION LIST

Patent Literature

Patent Literature 1:
  Japanese Patent Application Laid-Open Publication No. 2004-132861
Patent Literature 2:
  Japanese Patent Application Laid-Open Publication No. 2000-193705

SUMMARY OF INVENTION

Technical Problem

In inspection for occurrence of short circuit between a plurality of wiring paths formed on a surface of a substrate, only visual confirmation is done as to whether or not probes are in contact with any of the wiring paths and actual confirmation as to whether or not the probes are in electrical contact with the wiring paths is not performed. For the reason as above, cause of insulation cannot be determined among for example insulation between normal wiring paths and insulation by contact failure due to displacement, shortage of pressing, tester disorder, or cable breakage. This may invite erroneous determination of insulation by contact failure as insulation between normal wiring paths.

In order to avoid a problem as above, a method has been proposed in which two inspection probe heads are used for conduction check between ends of a single wiring path. However, a method such as above increases facility cost and a workload to double.

In addition, whether or not electrical connection between the probes and the wirings is actually established is not confirmed in both the wiring inspection apparatus disclosed in Patent Literature 1 and the circuit board inspection apparatus disclosed in Patent Literature 2.

The present invention has been made in view of the foregoing, and has its object of providing a technique through which whether or not probes are actually in electrical contact with a plurality of wirings formed on a substrate in inspection of the wirings is easily checked at low facility cost.

Solution to Problem

An inspection method according to one embodiment of the present invention is a method for performing an electrical inspection of a plurality of wiring paths that are electrically independent of one another and that are formed on a surface of a substrate.

The method includes: placing a probe set across terminal connection regions where respective one ends of the wiring paths are located; short-circuiting any one pair of wiring paths among the wiring paths in regions other than the terminal connection regions of the wiring paths; and determining whether or not a first resistance between the pair of wiring paths is smaller than a specific value, the first resistance being measured under a condition that the pair of wiring paths is short-circuited.

An inspection system according to one embodiment of the present invention is an inspection system that performs an electrical inspection of a plurality of wiring paths that are electrically independent of one another and that are formed on a surface of a substrate. The inspection system includes: a probe set to be placed across terminal connection regions where respective one ends of the wiring paths are located; a flexible conductor to be placed across regions except the terminal connection regions of the wiring paths to short-circuit any one pair of wiring paths among the wiring paths; and an inspection device including a determination section that determines whether or not a first resistance between the pair of wiring paths is smaller than a specific value, the first resistance being measured under a condition that the pair of wiring paths are short-circuited.

Advantageous Effects of Invention

According to an aspect of the present invention, a method for inspecting the wiring paths on the substrate can be implemented that can easily confirm at low facility cost whether or not the probes are actually in electrical connection with the wirings that are electrically independent of one another and that are formed on the substrate in inspection of the wiring paths.

Furthermore, according to an aspect of the inspection system of the present invention, electrical inspection of the wiring paths that are electrically independent of one another and that are formed on the surface of the substrate can be easily performed.

DESCRIPTION OF EMBODIMENTS

A plurality of wiring paths formed on a substrate to which the present invention is to be applied may each be constituted by a single wiring or plural wirings as long as the wiring paths are electrically independent of one another. Also, signals that are to propagate through the wiring paths electrically independent of one another may be all the same as or all different from one another.

In the following description, a first region refers to a terminal connection region where one end (connection terminal) of each of the wiring paths is formed on the substrate with which an electrode of a contact probe is to be brought into contact in electrical inspection of the wiring paths (for example, insulation inspection or conduction inspection) while a second region refers to a terminal connection region where the other end of each of the wiring paths is formed thereon with which the electrode of the contact probe is not to be brought into contact.

The following describes the present invention with reference to drawings using an aspect of propagation of different signals through a plurality of wiring paths constituted by a plurality of wirings.

First Embodiment

Figure 1:
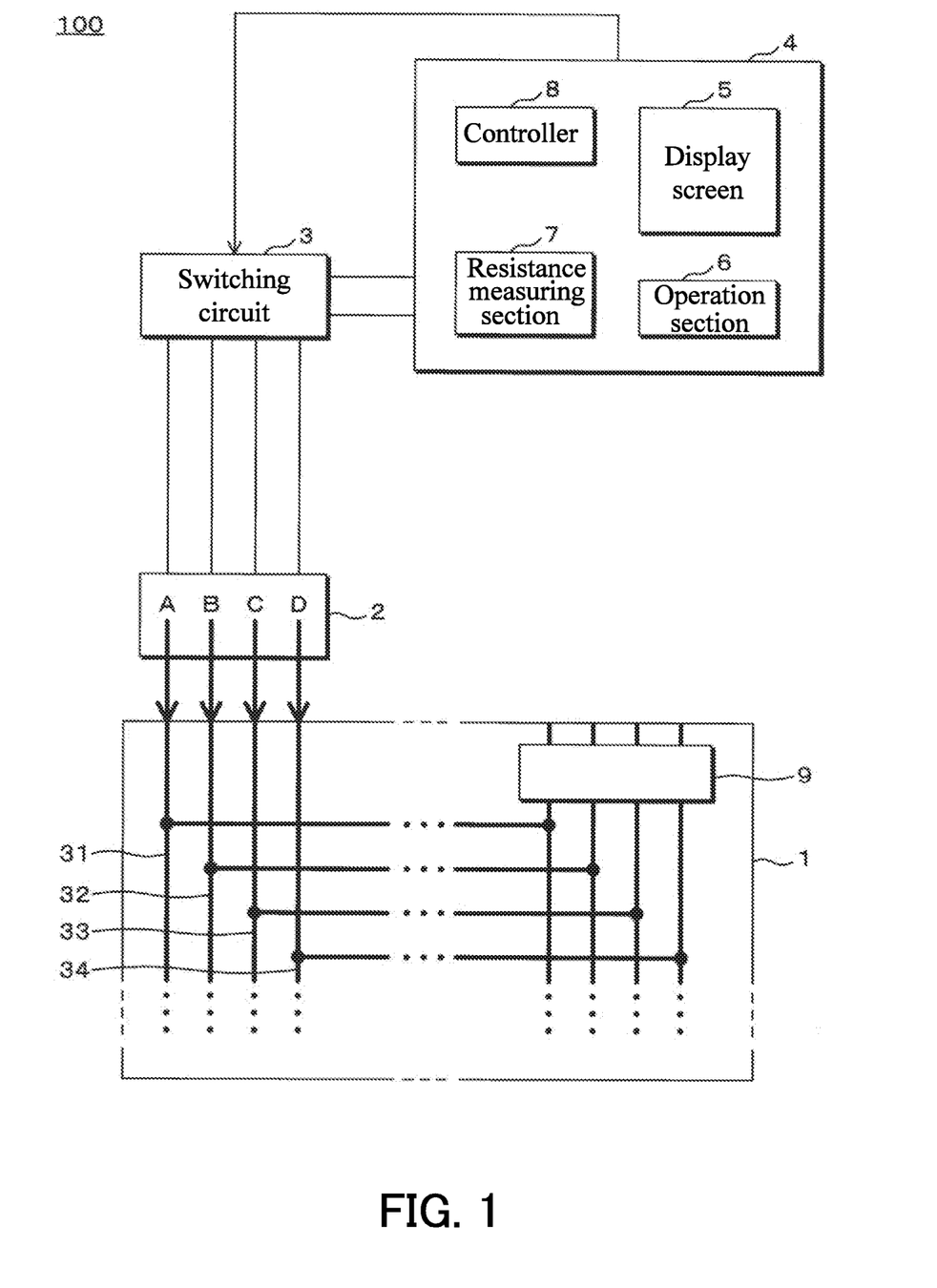
FIG. 1 is a block diagram schematically illustrating a configuration of a board wiring path inspection system according to an embodiment.

FIG. 1 is a block diagram schematically illustrating a configuration of an inspection system according to the present embodiment that performs an electrical inspection of wiring paths formed on a TFT substrate (array substrate) of a liquid crystal panel. The TFT substrate to which the present embodiment is applied may be a substrate before bonding to a counter substrate (CF substrate) or a liquid crystal panel after bonding and liquid crystal encapsulation.

The inspection system 100 according to the present embodiment includes a probe set 2, an inspection device 4, and a conductive rubber piece (flexible conductor) 9. The probe set 2 is connected to the inspection device 4 via a switching circuit 3 through wiring cords.

The inspection system 100 according to the present embodiment is operated on a TFT substrate (substrate) 1 as illustrated in FIG. 1. A wiring path 31 for propagation of a first signal, a wiring path 32 for propagation of a second signal, a wiring path 33 for propagation of a third signal, and a wiring path 34 for propagation of a fourth signal are formed on a surface of the substrate 1 as a plurality of wiring paths electrically independent from one another.

The probe set 2 illustrated in FIG. 1 has a configuration in which a plurality of probes (electrodes) for electrical inspection of the wiring paths are arranged in parallel. In order to easily reduce the present embodiment to practice, the probe set 2 used in the following description is a flexible printed circuit (FPC) in which four electrodes A, B, C, and D are formed in parallel to one another on a polyimide film. However, any probe set known as contact probes in the art that can establish conduction necessary for an electrical inspection only by bringing electrodes or the like into contact is usable as the probe set for reducing the present embodiment to practice. Note that a chip on film (COF) in which a chip (driver IC) is mounted on a FPC may be alternatively used as the probe set in the present embodiment.

As illustrated in FIG. 1, the electrodes A, B, C, and D of the probe set 2 are brought into contact with respective ends of four wiring paths 31, 32, 33, and 34 formed on the surface of the TFT substrate 1 in respective terminal connection regions (first regions). The terminal connection regions as above are preferably located at an edge of the surface of the TFT substrate 1 in order to facilitate electrical connection with an external of the substrate 1.

In order to enable easy substrate replacement even in a situation in which a substrate that is an inspection target is large in size, a probe head (not illustrated) that includes the probe set 2 includes an X-axis movement guide, a camera for position adjustment, a X-Y-axis movement guide, and a Z-axis movement guide. The X-axis movement guide is capable of moving the probe head itself over a large distance. The X-Y-axis movement guide is capable of finely adjusting a position of the probe head through visual check on an image captured by the camera. The Z-axis movement guide is used for focus adjustment on the camera.

An inspector manually moves the electrodes A, B, C, and D to an X-Y position where respective one ends of the wiring paths 31, 32, 33, and 34 are located while visually checking the image captured by the camera, and presses the probe set 2 in a Z direction with a pressing member such as a rubber piece. Use of a probe head such as above can aid contact between the probe set 2 and the wiring paths 31, 32, 33, and 34 in the above operation.

A TFT substrate includes a region (active region) in which a plurality of wirings and a plurality of pixels are arranged in a matrix and a region (frame region) surrounding the active region. In the TFT substrate as above, auxiliary capacitor wiring paths include a number of column wirings (auxiliary capacitor bus lines) and row wirings (first and second auxiliary capacitor main wirings). The column wirings extend transversely across the active region in a column direction. The row wirings extend in a row direction in the frame region. One end and the other end of each of the auxiliary capacitor bus lines are connected to the first auxiliary capacitor main wiring and the second auxiliary capacitor main wiring, respectively.

In a liquid crystal panel including the auxiliary capacitor wiring paths, control signals for control on auxiliary capacitors connected to the auxiliary capacitor bus lines connected to the main wirings are supplied from an auxiliary capacitor controller to the auxiliary capacitor main wirings and forwarded to the auxiliary capacitors through the auxiliary capacitor bus lines. In particular, a number of auxiliary capacitor bus lines are formed in a large-sized liquid crystal panel that implements display by area coverage modulation. The auxiliary capacitor bus lines are connected to the auxiliary capacitors provided at respective pixels (sub-pixels) arranged in a matrix. Therefore, the present embodiment is preferably applied to production of the liquid crystal panel. Specifically, occurrence of short circuit between wiring paths is checked by bringing probes into contact with ends of the auxiliary capacitor wiring paths in defect inspection of the liquid crystal panel.

That is, the substrate 1 to which the inspection system 100 according to the present embodiment is applied is a TFT substrate 1 for a liquid crystal panel and the wiring paths 31, 32, 33, and 34 each are an auxiliary capacitor wiring path for supplying a signal for control on a corresponding one of the auxiliary capacitors.

FIG. 1 illustrates four wiring paths. However the respective numbers of the first auxiliary capacitor main wirings (wirings extending in a vertical direction on the left in the drawing) and the second auxiliary capacitor main wirings (wirings extending in the vertical direction on the right in the drawing) in the TFT substrate are not limited to 4 and may be for example 2, 6, 12 or the like. The number of the auxiliary capacitor bus lines (wirings extending in a left-right direction in the drawing) may be different from those of the first auxiliary capacitor main wirings and the second auxiliary capacitor main wirings. It is only required that each one end of the auxiliary capacitor bus lines be connected to any one of the first auxiliary capacitor main wirings and each of the other ends of the auxiliary capacitor bus lines be connected to any one of the second auxiliary capacitor main wirings.

The number of electrodes formed at the film probes may be changed according to the number of auxiliary capacitor main wirings. For example, in a situation in which the auxiliary capacitor main wirings having terminals of which terminal width is 0.05 mm are formed at a terminal pitch of 0.072 mm, the electrodes of the probe set can be easily brought into contact with the connection terminals of the auxiliary capacitor main wirings by setting a sum of the terminal width and the terminal pitch of the electrodes of the probe set to be no greater than 2 mm.

The switching circuit 3 is connected to the electrodes A, B, C, and D of the probe set 2 through wiring cords, and connects selected two of the four wiring cords connected to the electrodes A, B, C, and D to input terminals of the inspection device 4.

The inspection device 4 is constituted by a personal computer, and includes a display screen 5, an operation section 6, a resistance measuring section 7, and a controller 8.

The display screen 5 displays for example inspection result and operation information on the inspection device 4 necessary for an inspector.

The operation section 6 receives input of operation by the inspector to the inspection device 4.

The resistance measuring section 7 provides low electrical current to the selected wiring cords, and measures a resistance between wiring paths connected to the selected wiring cords.

The controller 8 not only functions as a determination section to determine magnitude of a resistance measured by the resistance measuring section 7 but also controls positions of the probe set 2 and the conductive rubber piece 9, selection of wiring cords, and measurement by the resistance measuring section 7. Furthermore, the controller 8 performs information processing necessary for operation of the inspection device 4.

The conductive rubber piece 9 is a jig for short-circuiting a plurality of wiring paths. The conductive rubber piece 9 collectively short-circuits the wiring paths 31, 32, 33, and 34 by being placed across any regions of the wiring paths 31, 32, 33, and 34 (including the connection terminals in the second regions) except the first regions so as to be in contact with all of the wiring paths 31, 32, 33, and 34. Collective short circuit between the wiring paths can result in non-necessity of positional change of the conductive rubber piece 9 according to wiring cord selection.

The present embodiment can be reduced to practice in the TFT substrate 1 having the configuration illustrated in FIG. 1 by short-circuiting the connection terminals of the wiring paths 31, 32, 33, and 34 in the second regions while connecting the electrodes A, B, C, and D of the probe set 2 to the connection terminals in the first regions or short-circuiting the wiring paths 31, 32, 33, and 34 in any region of the wiring paths except the first regions and the second regions.

Note that resistance may be measured between two wiring paths among the plurality of wiring paths in the present embodiment. However, resistance is preferably measured between a single wiring path and a group (wiring path group) including the other wiring paths in order to reduce the number of processes. That is, it is preferable in the present embodiment that resistances are measured between the wiring path 31 and a group of the wiring paths 32, 33, and 34, between the wiring path 32 and a group of the wiring paths 31, 33, and 34, between the wiring path 33 and a group of the wiring paths 31, 32, and 34, and between the wiring path 34 and a group of the wiring paths 31, 32, and 33. In the above configuration, the switching circuit 3 connects all of the four wiring cords connected to the electrodes A, B, C, and D of the probe set 2 to the input terminals of the inspection device 4 and the controller 8 selects a wiring cord connected to a single wiring path for which resistance is to be measured and a wiring cord group corresponding to a wiring path group including the other wiring paths.

For example, when a measured resistance R is equal to or larger than a specific value in a preliminary inspection between the wiring path 31 and the group of the wiring paths 32, 33, and 34, it is determined that malfunction occurs in the wiring path 31 or the probe set. When the measured resistance R is smaller than the specific value in a main inspection between the wiring path 31 and the group of the wiring paths 32, 33, and 34, it is determined that the wiring path 31 is short-circuited.

In the present specification, a one-to-one relationship between one wiring path for which resistance is to be measured and another wiring path and a one-to-group relationship between the one wiring path and a group of the other wiring paths may be referred to as a "pair of" wiring paths or a wiring path "pair". The same is applied to the wiring cords. For example, a pair of wiring cords or a wiring cord pair selected from among the four wiring cords may include two wiring cords or one wiring cord and a group of the other wiring cords (three wiring codes).

As described above, the inspection system 100 according to the present embodiment is an inspection system that performs an electrical inspection on the substrate 1 having a surface on which the wiring paths 31, 32, 33, and 34, which are electrically independent of one another, are formed. The inspection system 100 includes the probe set 2, the flexible conductor 9, and the inspection device 4. The probe set 2 is to be placed across the terminal connection regions in which each one end of the wiring paths is located. The flexible conductor 9 short-circuits any pair of wiring paths by being placed across regions other than the terminal connection regions of the wiring paths. The inspection device 4 includes the determination section 8 that determines whether or not a first resistance measured between the pair of wiring paths is smaller than the specific value under a condition that the pair of wiring paths is short-circuited.

Figure 2:
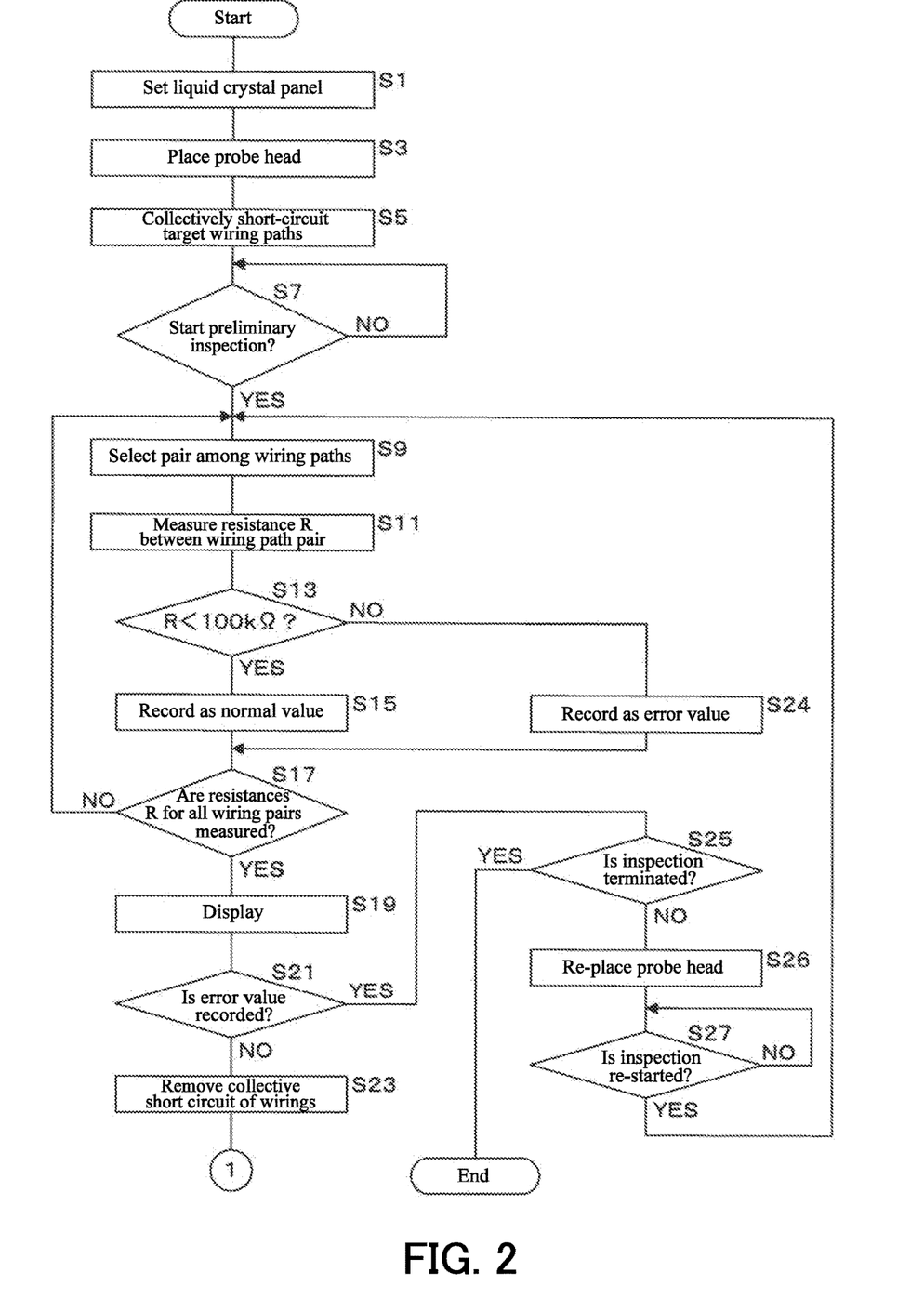
FIG. 2 is a flowchart depicting operation of the board wiring path inspection system according to the embodiment.
Figure 3:
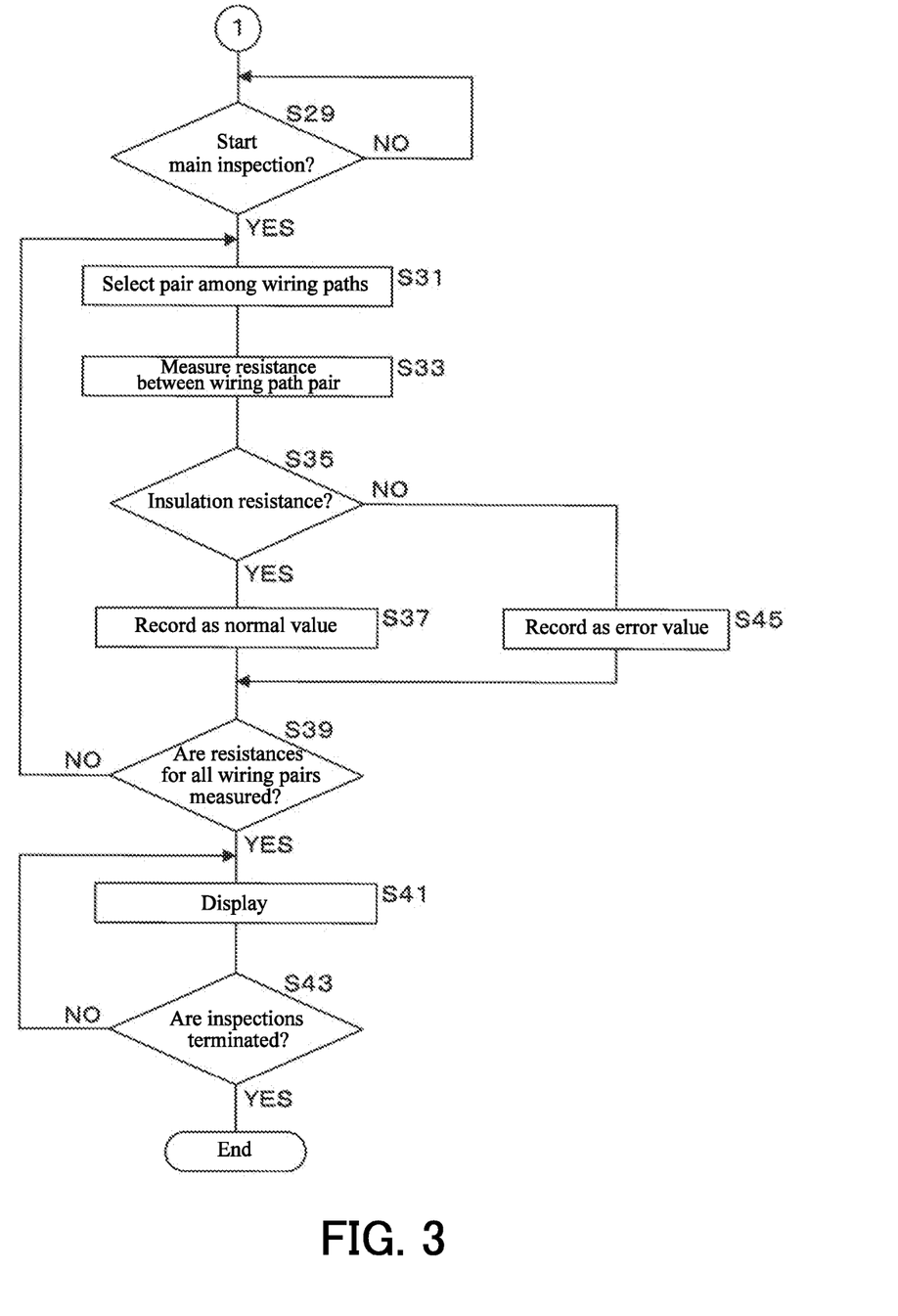
FIG. 3 is a flowchart depicting the operation of the board wiring path inspection system according to the embodiment.

The following describes operation of the inspection system having the above configuration with reference to flowcharts of FIGS. 2 and 3. Note that for the sake of simplicity, a pair of wiring paths or wiring cords indicates two wiring paths or wiring cords in the following description.

First, the TFT substrate 1 of a liquid crystal panel that is an inspection target is set on an inspection line (S1). Note that the TFT substrate 1 that is an inspection target may be a liquid crystal panel in which liquid crystal is encapsulated between the TFT substrate 1 and the counter substrate (CF substrate) bonded together.

Next, the probe head including the probe set 2 is placed across the first regions so as to bring the electrodes A, B, C, and D of the probe set 2 into contact with the connection terminals in the respective first regions (S3).

Subsequently, the conductive rubber piece 9 is placed so as to be in collective contact with the auxiliary capacitor wiring paths 31, 32, 33, and 34 in the second regions to short-circuit the auxiliary capacitor wiring paths 31, 32, 33, and 34 (S5).

When the operation section 6 receives an operation for starting a preliminary inspection (S7) in the above state, the switching circuit 3 selects one pair (two) among the four wiring cords connected to the electrodes A, B, C, and D and connects the pair of wiring cords to the input terminals of the inspection device 4 (S9).

The resistance measuring section 7 then measures (S11) a resistance R between the wiring cord pair connected (S9) to the input terminals. The controller 8 determines whether or not the resistance R measured by the resistance measuring section 7 is smaller than the specific value, for example, 1 k$\Omega$ or 100 k$\Omega$ (S13). That is, the controller 8 functions as the determination section 8 that determines whether or not the first resistance measured between the pair under a condition that the pair is short-circuited is smaller than the specific value (S9).

The controller 8 records the resistance R as a normal value (S15) when the resistance R is smaller than the specific value (S13) or records the resistance R as an error value (S24) when the resistance R is equal to or larger than the specific value (S13).

The controller 8 next determines whether or not resistances R for all of the wiring cord pairs have been measured (S17). When a negative determination is made, the switching circuit 3 selects a wiring cord pair for which resistance is not yet measured and connects the selected wiring cord pair to the input terminals of the inspection device 4 (S9).

When the controller 8 determines that the resistances R of all of the wiring cord pairs have been measured (S17), the preliminary inspection comes to an end and result of the preliminary inspection as recorded (S15 and/or S24) are displayed on the display screen 5 (S19).

In a situation in which a main inspection is performed subsequent to the preliminary inspection, the conductive rubber piece 9 is removed and collective short circuit among the auxiliary capacitor wiring paths 31, 32, 33, and 34 are eliminated (S23).

When the operation section 6 receives an operation for starting the main inspection (S29 in FIG. 3) in the above state, the switching circuit 3 selects a pair (two) of the wiring codes from among the four wiring cords connected to the electrodes A, B, C, and D and connects the selected wiring cord pair to the input terminals of the inspection device 4 (S31).

Next, the resistance measuring section 7 measures a resistance (S33) between the wiring cord pair connected (S31) to the input terminals, and the controller 8 determines whether or not the resistance measured by the resistance measuring section 7 corresponds to an insulation resistance (S35). That is, the controller 8 functions as the determination section 8 that determines whether or not the resistance measured between the pair under a condition that the pair is not short-circuited (second resistance) is smaller than the insulation resistance (specific value).

When the resistance measured by the resistance measuring section 7 corresponds to the insulation resistance (S35), the controller records the resistance as a normal value (S37). When the resistance measured by the resistance measuring section 7 does not correspond to the insulation resistance (S35), the controller records the resistance as an error value (S45).

The controller 8 next determines whether or not resistances for all of the wiring cord pairs have been measured (S39). When a negative determination is made, the switching circuit 3 selects a wiring cord pair for which resistance is not yet measured and connects the selected wiring cord pair to the input terminals of the inspection device 4 (S31).

When resistances for all of the wiring cord pairs have been measured (S39), the controller 8 causes the display screen 5 to display result of the main inspection (S37 and/or S45) together with the result of the preliminary inspection (S41). That is, the controller 8 functions as the determination section 8 that further determines whether or not the wiring paths are short-circuited according to the result of determination for the first resistances and the result of determination for the second resistances.

When the operation section 6 receives an operation for terminating the inspections in the above state (S43), the inspections is finished.

Note that any of for example contact failure of the conductive rubber piece or the probe set, breakage or a malfunction of a probe, a malfunction of the resistance measuring section, or breakage of a wring code may occur in a wiring cord pair for which a measured resistance R is equal to or larger than the specific value in the preliminary inspection (S21 in FIG. 2). In the above situation, it is possible that determination is re-performed (S13) as to whether or not the resistance R measured (S9 and S11) for the wiring cord pair is smaller than the specific value after at least one of the probe set and the conductive rubber piece is changed in position (S26 and S27) and result of determination is displayed on the display screen 5 (S19). In the above configuration, the probe set or the like can be replaced or so after the inspection is once terminated (S25) unless the resistance R (S9 and S11) is not smaller than the specific value (S13).

That is, the determination section 8 of the inspection system 100 according to the present embodiment further determines whether or not short circuit is established between wiring paths according to result of determination for the first resistances and result of determination for the second resistances. When a measured value for at least one of the first resistances is equal to or larger than the corresponding specific value, the position of the probe set 2 is changed as necessary so that the measured value is smaller than the specific value. The determination section 8 then performs further determination.

Alternatively, it is possible that when a resistance not corresponding to the insulation resistance is measured for a wiring code pair in the main inspection, determination is re-performed as to whether or not a resistance measured for the wiring cord pair corresponds to the insulation resistance after at least one of the probe set and the conductive rubber piece is changed in position and result of determination is displayed on the display screen 5.

According to the present embodiment, in which the probe set and the conductive rubber piece, which are low in cost, are used, facility cost and working hours can be reduced. Furthermore, according to the present embodiment, the number of the probe sets necessary for conduction inspection can be reduced from 2 to 1, thereby enabling implementation of inspection of the wiring paths on the TFT substrate of the liquid crystal panel at an expense approximately half of that for a prior art device.

Note that description has been made about an aspect in which an inspector performs setting of the TFT substrate 1 onto the inspection line, placement and removal of the probe set 2 and the conductive rubber piece 9 and the controller 8 controls the other operations according to information from the operation section 6 that receives instructions from the inspector. However, the present embodiment encompasses an aspect in which the controller 8 controls all operations except setting of the TFT substrate 1 onto the inspection line.

Second Embodiment

In a situation in which the substrate 1 to which the inspection system 100 according to the present embodiment is applied is a TFT substrate 1 of a liquid crystal panel, the wiring paths formed on the surface of the substrate 1 may include not only wiring paths (auxiliary capacitor wiring paths) for supplying signals for auxiliary capacitor control but also a wiring path (common electrode wiring path) for supplying a signal for generation of a reference potential of a common electrode.

Figure 4:
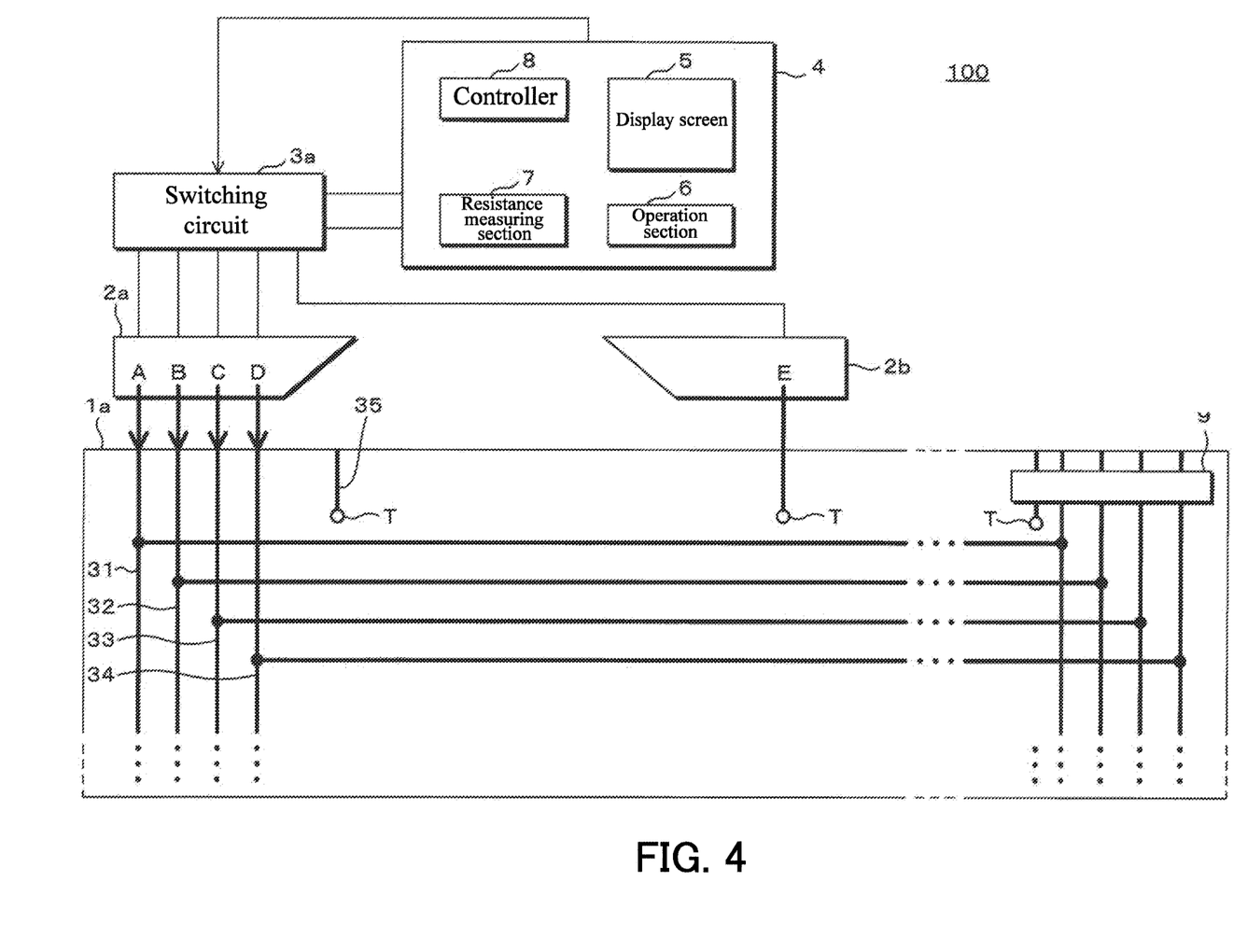
FIG. 4 is a block diagram schematically illustrating a configuration of a substrate wiring path inspection system according to an embodiment.

FIG. 4 is a block diagram schematically illustrating a configuration of an inspection system according to the present embodiment for electrical inspection of wiring paths formed on a TFT substrate of a liquid crystal panel. FIG. 4 illustrates a TFT substrate having a substrate edge at which a plurality of connection portions T, . . . connected to the counter substrate are formed. The connection portions T, . . . are for application of a specific potential to the common electrode provided on the counter substrate. However, the TFT substrate to which the present embodiment is applied is a liquid crystal panel after bonding to a counter substrate (CR substrate) and liquid crystal encapsulation rather than a substrate before bonding.

The inspection system 100 according to the present embodiment includes probe sets 2a and 2b, the inspection device 4, and the conductive rubber piece 9. The probe sets 2a and 2b are each connected to the inspection device 4 through the wiring cords via a switching circuit 3a.

The inspection system 100 according to the present embodiment is operated on the TFT substrate (substrate) 1a as shown in FIG. 4. Similarly to the first embodiment, the auxiliary capacitor wiring paths 31, 32, 33, and 34 are formed on the surface of the substrate 1a. In addition, a common electrode wiring path 35 is formed thereon as one of the plurality of wiring paths electrically independent of one another.

Although the common electrode wiring path 35 is a path from a connection terminal of the TFT substrate 1a in the first region to the common electrode on the counter substrate via one of the connection portions T, the common electrode wiring path 35 extending from the connection terminal to the connection portion T is illustrated in the drawing for the sake of convenience.

Similarly to the first embodiment, the probe sets 2a and 2b in the present embodiment each are a FPC (or COF) including a polyimide film and electrodes formed on the polyimide film. The probe set 2a is to connect the electrodes A, B, C, and D to respective ends of the four auxiliary capacitor wiring paths 31, 32, 33, and 34 formed on the surface of the TFT substrate 1a, while the probe set 2b has an electrode E and is to connect the electrode E to an end of the common electrode wiring path 35 formed on the surface of the TFT substrate 1a.

In a situation in which a distance between the auxiliary capacitor wiring path 34 and the common electrode wiring path 35 is 2 mm or more, electrodes on a single FPC (or COF) as a probe set having a dimension in which a sum of the terminal width and the terminal pitch of the electrodes of the probe set is no greater than 2 mm, such as the probe set 2 used in the first embodiment, cannot be accurately brought into contact with the auxiliary capacitor wiring paths 31, 32, 33, and 34 and the common electrode wiring path 35.

However, use of the two probe sets 2a and 2b can enable electrical inspection between the auxiliary capacitor wiring path 34 and the common electrode wiring path 35 in the same manner as that in the first embodiment. In a situation in which the distance between the auxiliary capacitor wiring path 34 and the common electrode wiring path 35 is less than 2 mm, use of only one probe set such as that in the first embodiment can enable electrical inspection.

The other configuration and operation are the same as those described in the first embodiment, and therefore, description thereof is omitted.

Reduction of the present embodiment to practice can achieve reduction in possibility of wiring burning of the liquid crystal panel in tentative turning-on thereof without driving transistors.

Third Embodiment

Figure 5:
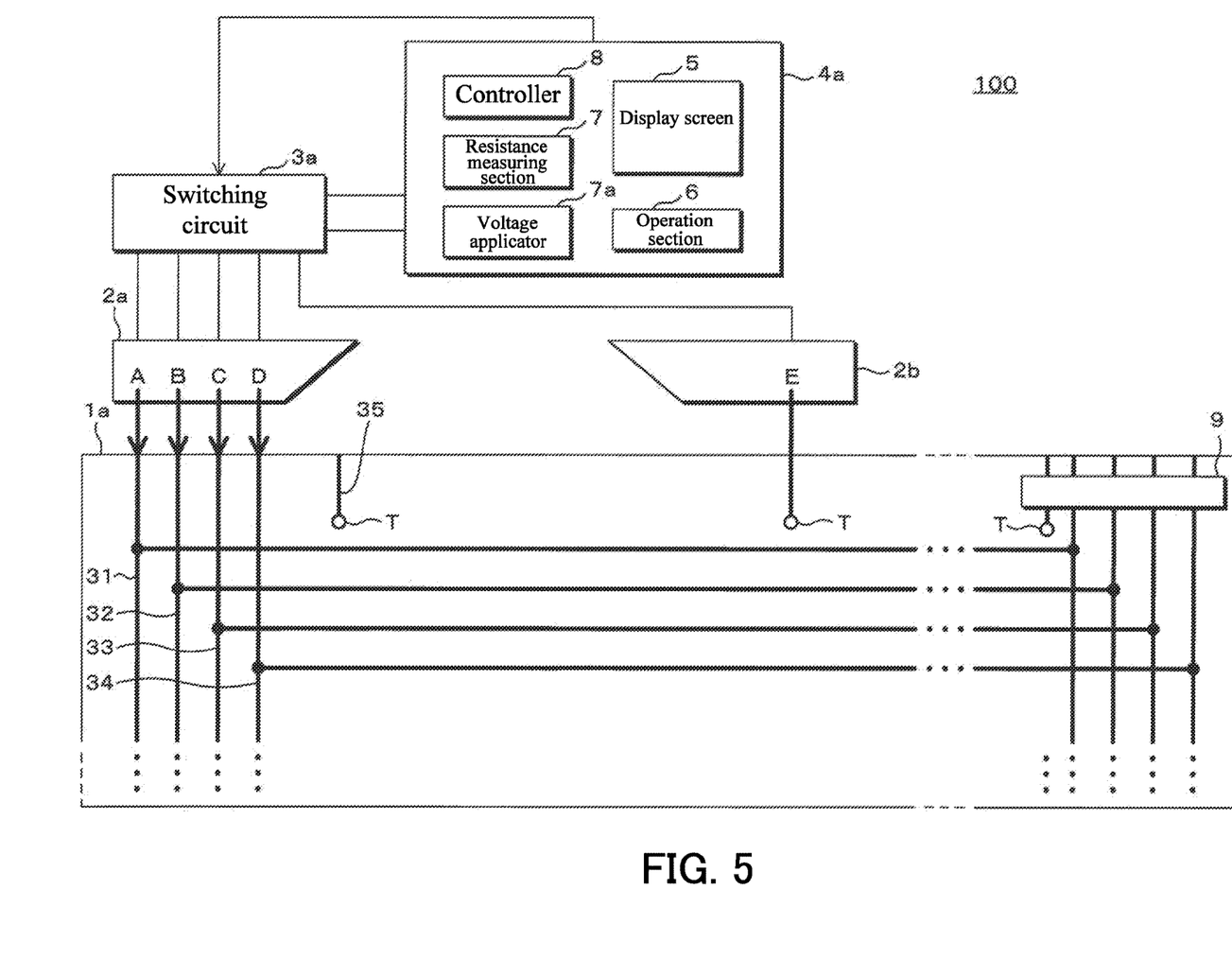
FIG. 5 is a block diagram schematically illustrating a configuration of a liquid crystal panel inspection system according to an embodiment.

FIG. 5 is a block diagram schematically illustrating a configuration of an inspection system according to the present embodiment for electrical inspection of wiring paths formed on a TFT substrate of a liquid crystal panel. FIG. 5 illustrates a TFT substrate having a substrate edge at which a plurality of connection portions T, . . . connected to the counter substrate are formed. The connection portions T, . . . are for application of a specific potential to the common electrode provided on the counter substrate. However, the TFT substrate to which the present embodiment is applied is a liquid crystal panel after bonding to a counter substrate (CR substrate) and liquid crystal encapsulation rather than a substrate before bonding.

Although the common electrode wiring path 35 is a path from a connection terminal of the TFT substrate 1a in the first region to the common electrode on the counter substrate via one of the connection portions T also in the present embodiment, the common electrode wiring path 35 extending from the connection terminal to the connection portion T is illustrated in the drawing for the sake of convenience.

An inspection device 4a is constituted by a personal computer, and includes the display screen 5, the operation section 6, the resistance measuring section 7, a voltage applicator 7a, and the controller 8.

The voltage applicator 7a applies a specific voltage collectively to all of the auxiliary capacitor wiring paths 31, 32, 33, and 34 and the common electrode wiring path 35 through the respective wiring cords connected to the switching circuit 3a to turn on all pixels formed on the surface of the TFT substrate 1a of the liquid crystal panel.

When voltage is applied to the auxiliary capacitor wiring paths and the common electrode wiring path each formed on the TFT substrate in a situation in which accurate connection is not established between the probe set and the wiring paths, the wiring may be burned. However, when the second embodiment is reduced to practice, whether or not the connection is established can be confirmed. Consequently, a possibility of wiring burning can be significantly reduced.

Furthermore, when voltage is applied to the auxiliary capacitor wiring paths and the common electrode wiring path each formed on the TFT substrate of the liquid crystal panel, the liquid crystal panel can be tentatively turned on without driving the transistors.

When the liquid crystal panel suffers from local stress (e.g., pressing or suction), a distance between the counter substrate (CF substrate) and the array substrate (TFT substrate) may locally vary to cause irregularity in cell thickness. As a result, irregularity in luminance may occur in turning-on of the panel. According to the present embodiment, which can enable tentative turning-on of the liquid crystal panel, occurrence of irregularity in luminance can be checked.

The other configuration and operation are the same as those described in the second embodiment, and therefore, description thereof is omitted.

Inspection for turning on a liquid crystal panel and inspection for irregularity in cell thickness of the liquid crystal panel as above are done after confirmation that the probe sets 2a and 2b are accurately connected to the wiring paths on the TFT substrate. Consequently, a possibility of wiring burning can be reduced.

Note that an electrical inspection of wiring paths in the present embodiment encompasses the inspections for turning on the liquid crystal panel and the inspection for irregularity in cell thickness of the liquid crystal panel.

The present invention has been described so far using the embodiments of the inspection system for performing electrical inspection of the wiring paths formed on the TFT substrate of the liquid crystal panel. However, the present invention also encompasses an aspect of an inspection method implemented by the inspection system (method for performing an electrical inspection of wiring paths on a substrate). That is, it can be said that an embodiment of the present invention encompasses an inspection method including: placing the probe set of the system; placing the conductive rubber piece (flexible conductor) of the system; and performing determination in the system.

INDUSTRIAL APPLICABILITY

The present invention can be utilized in production of a circuit board or a liquid crystal panel, and is advantageous particularly in inspection for irregularity in cell thickness of a liquid crystal panel and insulation inspection of auxiliary capacitor wiring paths or a common electrode wiring path of a liquid crystal panel.

REFERENCE SINGS LIST 1, 1a TFT substrate (substrate)
2, 2a, 2b probe set
3, 3a switching circuit
4, 4a inspection device
5 display screen
6 operation section
7 resistance measuring section
7a voltage applicator
8 controller (determination section)
9 conductive rubber piece (flexible conductor)
31, 32, 33, and 34 auxiliary capacitor wiring path (wiring path)
35 common electrode wiring path (wiring path)

The invention claimed is:

1. An inspection system that performs an electrical inspection of a plurality of wiring paths that are electrically independent of one another and that are formed on a surface of a substrate, the inspection system comprising:
   a probe set to be placed across terminal connection regions where respective one ends of the wiring paths are located;
   a flexible conductor to be placed across regions except the terminal connection regions of the wiring paths to short-circuit any one pair of wiring paths among the wiring paths; and
   an inspection device including a determination section that determines whether or not a first resistance between the pair of wiring paths is smaller than a specific value, the first resistance being measured under a condition that the pair of wiring paths is short-circuited, wherein
   the substrate is a TFT substrate of a liquid crystal panel, and
   the wiring paths include wiring paths for supplying signals for auxiliary capacitor control.

2. The inspection system according to claim 1, wherein the determination section further determines whether or not a second resistance between the pair of wiring paths is smaller than a specific value, the second resistance being measured under a condition that the pair of wiring paths is not short-circuited.

3. The inspection system according to claim 2, wherein the determination section further determines whether or not short circuit is established between the pair of wiring paths among the plurality of wiring paths according to result of determination for the first resistance and result of determination for the second resistance.

4. An inspection method for performing an electrical inspection of a plurality of wiring paths that are electrically independent of one another and that are formed on a surface of a substrate, the inspection method comprising:
   placing a probe set across terminal connection regions where respective one ends of the wiring paths are located;
   short-circuiting any one pair of wiring paths among the wiring paths in regions other than the terminal connection regions of the wiring paths; and
   determining whether or not a first resistance between the pair of wiring paths is smaller than a specific value, the first resistance being measured under a condition that the pair of wiring paths is short-circuited, wherein
   the substrate is a TFT substrate of a liquid crystal panel, and
   the wiring paths include a wiring path for supplying a signal for generation of a reference potential of a common electrode.

5. The inspection method according to claim 4, further comprising
   determining whether or not a second resistance between the pair of wiring paths is smaller than a specific value, the second resistance being measured under a condition that the pair of wiring paths is not short-circuited.

6. The inspection method according to claim 5, further comprising
   determining whether or not short circuit is established between the pair of wiring paths among the plurality of wiring paths according to result of determination for the first resistance and result of determination for the second resistance.

7. An inspection system that performs an electrical inspection of a plurality of wiring paths that are electrically independent of one another and that are formed on a surface of a substrate, the inspection system comprising:

a probe set to be placed across terminal connection regions where respective one ends of the wiring paths are located;

a flexible conductor to be placed across regions except the terminal connection regions of the wiring paths to short-circuit any one pair of wiring paths among the wiring paths; and an inspection device including a determination section that determines whether or not a first resistance between the pair of wiring paths is smaller than a specific value, the first resistance being measured under a condition that the pair of wiring paths is short-circuited, wherein the substrate is a TFT substrate of a liquid crystal panel, and the wiring paths include a wiring path for supplying a signal for generation of a reference potential of a common electrode.

8. The inspection system according to claim 7, wherein the determination section further determines whether or not a second resistance between the pair of wiring paths is smaller than a specific value, the second resistance being measured under a condition that the pair of wiring paths is not short-circuited.

9. The inspection system according to claim 8, wherein the determination section further determines whether or not short circuit is established between the pair of wiring paths among the plurality of wiring paths according to result of determination for the first resistance and result of determination for the second resistance.

* * * * *